(12) United States Patent
Cho et al.

(10) Patent No.: US 12,347,672 B2
(45) Date of Patent: Jul. 1, 2025

(54) SILICON PRECURSOR COMPOUNDS AND METHOD FOR FORMING SILICON-CONTAINING FILMS

(71) Applicant: ENTEGRIS, INC., Billerica, MA (US)

(72) Inventors: Sungsil Cho, Anyang-si (KR); DaHye Kim, Suwon-si (KR); HwanSoo Kim, Hwaseong-si (KR); SooJin Lee, Suwon-si (KR); Bryan C. Hendrix, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/726,079

(22) Filed: Apr. 21, 2022

(65) Prior Publication Data

US 2022/0359192 A1    Nov. 10, 2022

Related U.S. Application Data

(60) Provisional application No. 63/177,643, filed on Apr. 21, 2021.

(51) Int. Cl.
```
H01L 21/02     (2006.01)
C23C 16/40     (2006.01)
C23C 16/455    (2006.01)
```
(52) U.S. Cl.
CPC ...... *H01L 21/02164* (2013.01); *C23C 16/402* (2013.01); *C23C 16/45531* (2013.01); *C23C 16/45553* (2013.01); *H01L 21/0228* (2013.01); *H01L 21/02274* (2013.01)

(58) Field of Classification Search
CPC ........ C23C 16/45553; C23C 16/45525; H01L 21/0228; H01L 21/02211
See application file for complete search history.

(56) References Cited

U.S. PATENT DOCUMENTS

| | | | |
|---|---|---|---|
| 2005/0025885 A1* | 2/2005 | McSwiney | C23C 16/345 427/255.28 |
| 2005/0085081 A1* | 4/2005 | Liaw | H01L 29/66772 257/E29.147 |
| 2007/0032676 A1 | 2/2007 | Todd | |
| 2008/0026149 A1 | 1/2008 | Tomasini | |
| 2008/0224317 A1 | 9/2008 | Machkaoutsan | |

(Continued)

FOREIGN PATENT DOCUMENTS

| | | | |
|---|---|---|---|
| CN | 107540705 | * | 5/2018 |
| JP | 2005320583 A | | 11/2005 |

(Continued)

OTHER PUBLICATIONS

Eaborn, Colin et al., Some Derivatives of Tris (Dimethylilsil)Methane. A Novel Bicyclic Tris(Disiloxane) with a Manxane Structure, Journal of Organometallic Chemistry, 1983, pp. 281-288, vol. 252, School of Chemistry and Molecular Sciences, University of Sussex, Brighton, Great Britain.

(Continued)

*Primary Examiner* — Tabassom Tadayyon Eslami

(57) ABSTRACT

Provided are certain silicon precursor compounds which are useful in the formation of silicon-containing films in the manufacture of semiconductor devices, and more specifically to compositions and methods for forming such silicon-containing films, such as films comprising silicon dioxide.

11 Claims, 4 Drawing Sheets

(56) References Cited

U.S. PATENT DOCUMENTS

| | | | | |
|---|---|---|---|---|
| 2009/0075490 | A1* | 3/2009 | Dussarrat | H01L 21/0228 |
| | | | | 257/E21.24 |
| 2013/0267079 | A1* | 10/2013 | Underwood | H01L 21/02529 |
| | | | | 438/478 |
| 2013/0320429 | A1 | 12/2013 | Thomas | |
| 2015/0132587 | A1* | 5/2015 | Nishio | C23C 14/0036 |
| | | | | 428/447 |
| 2015/0162185 | A1* | 6/2015 | Pore | C23C 16/45553 |
| | | | | 438/786 |

FOREIGN PATENT DOCUMENTS

| | | | |
|---|---|---|---|
| WO | 2002080244 | A2 | 10/2002 |
| WO | 2015112324 | A1 | 7/2015 |

OTHER PUBLICATIONS

Hwang, Su Min, et al., Ozone based high-temperature atomic layer deposition of SiO2 thin films, Japanese Journal of Applied Physics, Mar. 6, 2020, pp. SIIG05-1-SIIG05-5, vol. 59, The Japan Society of Applied Physics.

O'Neill, Mark L., et al., Impact of Aminosilane Precursor Structure on Silicon Oxides by Atomic Layer Deposition, The Electrochemical Society Interface, 2011, pp. 33-37, vol. 20, No. 4.

\* cited by examiner

SILICON PRECURSOR COMPOUNDS AND METHOD FOR FORMING SILICON-CONTAINING FILMS

FIELD OF THE INVENTION

In general, the invention relates to methods and precursors for the deposition of silicon-containing films onto microelectronic device surfaces.

BACKGROUND OF THE INVENTION

In semiconductor manufacturing, thin (e.g., <1000 nanometers thickness) passive layers of chemically inert dielectric materials, such as silicon nitride ($Si_3N_4$), silicon oxynitride ($SiO_xN_y$), silicon carbide (SiC), silicon carbon nitride (SiCN) and silicon carbo oxide (SiCO) and/or silicon dioxide ($SiO_2$) are widely employed in microelectronic device structures, to function as structural elements of the multi-layered device such as sidewall spacer elements, diffusion masks, oxidation barriers, trench isolation coatings, intermetallic dielectric materials, passivation layers, insulators and etch-stop layers.

Deposition of silicon-containing films by chemical vapor deposition techniques is a highly attractive methodology for forming such films. CVD processes involving low deposition temperatures are particularly desired, e.g., temperatures less than about 450° C., but require the availability of suitable silicon precursor compounds for such purpose. In some cases, higher deposition temperatures can be considered, when the thermal budget of the integrated circuit will allow. In these cases, temperatures>450° C. might be utilized to achieve the desired dielectric film. Accordingly, a need exists for precursors for the formation of silicon-containing films which can be utilized at such higher temperatures. In particular, there is a need for liquid silicon precursors with good thermal stability, high volatility, and reactivity with a substrate surface.

SUMMARY OF THE INVENTION

The invention relates generally to the formation of silicon-containing films in the manufacture of semiconductor devices, and more specifically to compositions and methods for forming such silicon-containing films. In one particular embodiment, the precursor tris(dimethylsilyl)methane was found useful in forming silicon dioxide films of high purity and at a high growth rate, i.e., about 1.7 Å/cycle at 600° C. using ozone as oxidizing gas (see FIG. 1). Moreover, as shown by the data represented in FIG. 3, the wet etch rate (WER) of the film resulting from this precursor was improved by about 77% over the resulting silicon dioxide film formed utilizing BTBAS with ozone. Additionally, when compared to thermal oxide, the silicon oxide films formed using the precursor compounds of the present invention in conjunction with ozone exhibit a wet etch rate (200:1 dilute HF) which is less than about 3 times the wet etch rate of thermally grown silicon oxide. Tris(dimethylsilyl)methane (TDMSM) was found to be thermally stable at temperatures above 600° C., thus rendering it useful in relatively high temperature atomic layer deposition processes where high purity silicon dioxide films are desired.

DETAILED DESCRIPTION OF THE INVENTION

Figure 1:
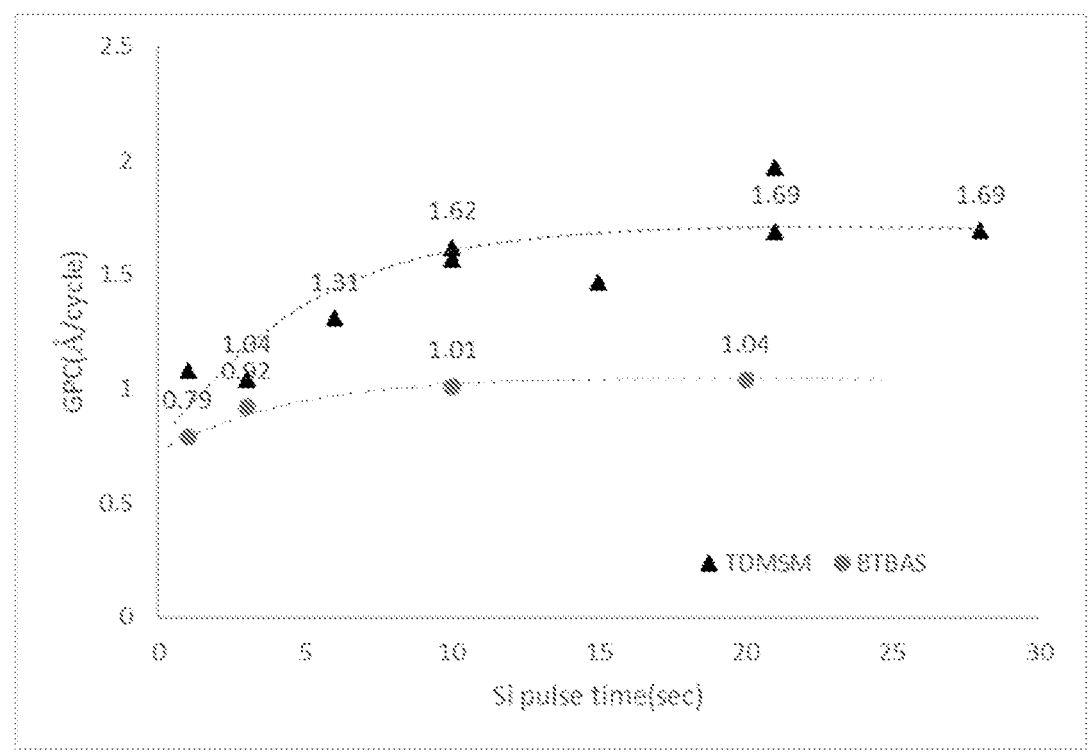
FIG. 1 is a graph of growth rate (Å/cycle) versus precursor pulse time in seconds, utilizing ozone as an oxidizing gas, with an exemplary compound of Formula (I) of the present invention, i.e., TDMSM, utilizing ozone as an oxidizing gas. Also represented in FIG. 1 is the performance of bis(t-butylamino)silane (BTBAS) as a comparison.
Figure 2:
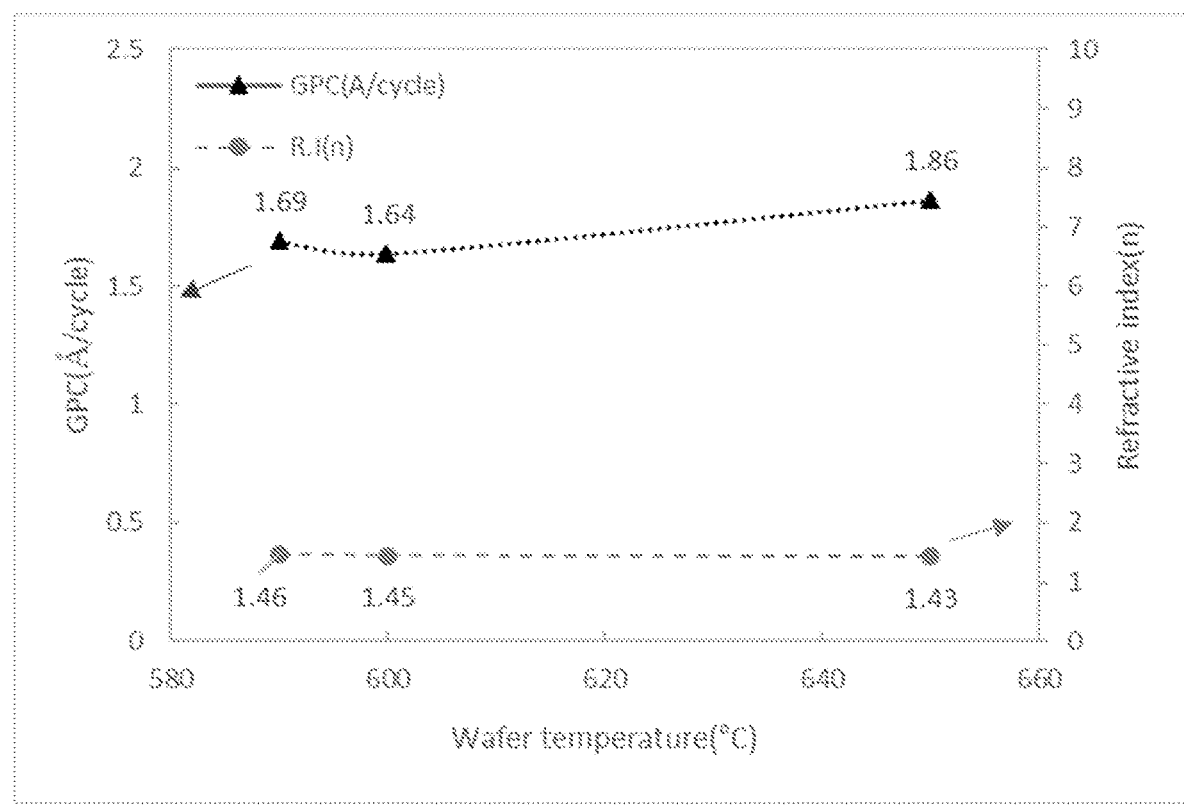
FIG. 2 illustrates the growth rate/cycle for an ALD silicon dioxide deposition process while varying the substrate temperature from 590° C. to 650° C. The circle points represent the saturation curve and the triangle points represent the refractive index. In this experiment, a flow rate of 1000 sccm of $O_3$ was utilized. The pulsed deposition cycle sequence utilized was (i) precursor for 21 seconds, (ii) purge for 15 seconds, (iii) ozone for 30 seconds, and (iv) purge for 15 seconds.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

In a first aspect, the invention provides a method for forming a silicon-containing film on the surface of a microelectronic device in a reaction zone, which comprises introducing at least one compound of Formula (I):

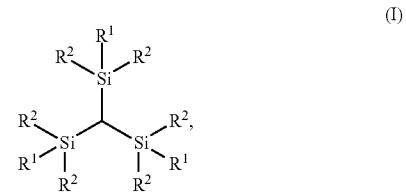

(I)

wherein each $R^1$ and each $R^2$ is independently chosen from hydrogen and $C_1$-$C_{10}$ alkyl, to said reaction zone, under vapor deposition conditions. Examples of $C_1$-$C_{10}$ alkyl include from methyl, ethyl, n-propyl, n-butyl, and the like.

In one embodiment, each $R^1$ is hydrogen and each $R^2$ is methyl; in this embodiment, the compound of Formula (I) has he following structure:

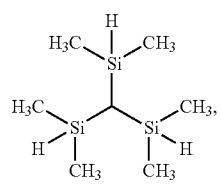

referred to herein by the abbreviation "TDMSM".

In other embodiments, each $R^2$ is ethyl, each $R^2$ is n-propyl, each $R^2$ is n-butyl, or each $R^2$ is independently chosen from methyl, ethyl, n-propyl, or n-butyl.

The compounds of Formula (I) are useful as precursors in the vapor deposition of silicon-containing films and, in particular, films on the surface(s) of microelectronic devices. In certain embodiments, the films also contain nitrogen and/or oxygen and/or carbon.

As used herein, the term "silicon-containing film" refers to films such as silicon dioxide, silicon nitride, silicon oxynitride, silicon carbide, silicon carbonitride, silicon oxycarbonitride, low-k thin silicon-containing films, high-k gate silicate films and low temperature silicon epitaxial films.

In certain embodiments, vapor deposition conditions comprise reaction conditions known as chemical vapor deposition, pulsed-chemical vapor deposition, and atomic layer deposition. In the case of pulsed-chemical vapor deposition, a series of alternating pulses of precursor compounds and co-reactant(s), either with or without an intermediate (inert gas) purge step, can be utilized to build up the film thickness to a desired endpoint.

chemical vapor deposition (PECCVD), a flowable chemical vapor deposition (FCVD), or a plasma-enhanced ALD-like process. Such vapor deposition processes can be utilized to form silicon-containing films on microelectronic devices to form films having a thickness of from about 20 angstroms to about 2000 angstroms.

In the process of the invention, the compounds above may be reacted with the desired microelectronic device substrate in any suitable manner, for example, in a single wafer CVD, ALD and/or PECVD or PEALD chamber, or in a furnace containing multiple wafers.

Alternatively, the process of the invention can be conducted as an ALD or ALD-like process. As used herein, the terms "ALD or ALD-like" refer to processes such as (i) each reactant including the silicon precursor compound of Formula (I) and an oxidizing and/or reducing gas is introduced sequentially into a reactor such as a single wafer ALD reactor, semi-batch ALD reactor, or batch furnace ALD reactor, or (ii) each reactant, including the silicon precursor compound of Formula (I) and an oxidizing and/or reducing gas is exposed to the substrate or microelectronic device surface by moving or rotating the substrate to different sections of the reactor and each section is separated by an inert gas curtain, i.e., spatial ALD reactor or roll to roll ALD reactor.

In general, the desired film produced using the precursor compounds of Formula (I) can be tailored by choice of each compound, coupled with the utilization of reducing or oxidizing co-reactants. See, for example, the following Scheme 1 which illustrates how the precursors of Formula (I) may be utilized in vapor deposition processes:

Scheme 1

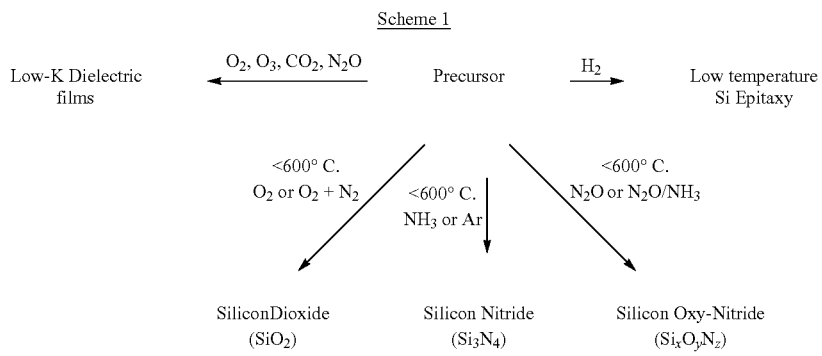

In certain embodiments, the pulse time (i.e., duration of precursor exposure to the substrate) for the precursor compounds depicted above ranges between about 1 and 30 seconds. When a purge step is utilized, the duration is from about 1 to 20 seconds or 1 to 30 seconds. In other embodiments, the pulse time for the co-reactant ranges from 5 to 60 seconds.

In one embodiment, the vapor deposition conditions comprise a temperature of about 100° C. to about 1000° C., such as about 450° C. to about 1000° C., and a pressure of about 0.5 to about 1000 Torr. In another embodiment, the vapor deposition conditions comprise a temperature of about 100° C. to about 800° C., such as about 500° C. to about 750° C.

The compounds above can be employed for forming high-purity thin silicon-containing films by any suitable vapor deposition technique, such as chemical vapor deposition (CVD), digital (pulsed) CVD, atomic layer deposition (ALD), pulsed plasma processes, plasma enhanced cyclical In one embodiment, the vapor deposition processes may further comprise a step involving exposing the precursor to a gas such as $H_2$, $H_2$ plasma, $H_2/O_2$ mixtures, water, $N_2O$, $N_2O$ plasma, $NH_3$, $NH_3$ plasma, $N_2$, or $N_2$ plasma. For example, an oxidizing gas such as $O_2$, $O_3$, $N_2O$, water vapor, alcohols or oxygen plasma may be used. In one embodiment, the precursor TDMSM is utilized in an ALD process with 03 as the oxidizing gas. In certain embodiments, the oxidizing gas further comprises an inert gas such as argon, helium, nitrogen, or a combination thereof. In another embodiment, the oxidizing gas further comprises nitrogen, which can react with the precursors of Formula (I) under plasma conditions to form silicon oxynitride films.

In one embodiment, the invention relates to a high temperature thermal atomic layer deposition (ALD) process for depositing low wet etching rate silicon dioxide films using ozone as an oxidizing gas.

In another embodiment, the vapor deposition processes above may further comprise a step involving exposing the film to a reducing gas. In certain embodiments of the present invention, the reducing gas is comprised of gases chosen from $H_2$, hydrazine ($N_2H_4$), methyl hydrazine, t-butyl hydrazine, 1,1-dimethylhydrazine, 1,2-dimethylhydrazine, and $NH_3$.

The compounds of Formula (I) are capable of low-temperature PECVD and/or PEALD formation of silicon-containing films as well as high temperature ALD. Such compounds exhibit high volatility and chemical reactivity but are stable with respect to thermal degradation at temperatures involved in the volatilization or vaporization of the precursor, allowing consistent and repeatable transport of the resulting precursor vapor to the deposition zone or reaction chamber. In this regard, it has been found that surprisingly TDMSM is stable at temperatures in excess of 600° C. and further that TDMSM does not exhibit thermal degradation until about 650° C. The chemical reactivity of the compounds of Formula (I) allows for film growth utilizing PEALD techniques at low temperatures at which traditional silicon precursor materials such as TEOS are inert and thus, exhibit little or no deposition behavior. Additionally, as noted above, FIG. 3 graphically illustrates greatly improved wet etch performance of an exemplary compound of Formula (I) of the present invention, (i.e., TDMSM) over the performance of the known silicon precursor BTBAS (bis(tertiary-butylamino)silane).

Accordingly, in a further embodiment, the invention provides the method of the invention as set forth above, wherein the silicon-containing film is silicon dioxide, and wherein the silicon dioxide film thus formed exhibits a wet etch rate which is at least about 70% improved compared to that of $SiO_2$ deposited with BTBAS and ozone. As noted above, when compared to thermal oxide, the silicon oxide films formed using the precursor compounds of the present invention in conjunction with ozone exhibit a wet etch rate (200:1 dilute HF) which is less than about 3 times the wet etch rate of thermally grown silicon oxide. Thus, in a further aspect, the invention provides a silicon oxide film having a 200:1 dilute hydrogen fluoride solution wet etch rate which is less than about 3 times the etch rate of thermally grown silicon oxide.

While using the precursor compounds of Formula (I), the incorporation of carbon and nitrogen into such films may be accomplished by utilization of co-reactants such as carbon in the form of methane, ethane, ethylene or acetylene for example, to further introduce carbon content into the silicon-containing films, thereby producing silicon carbide. Similarly, nitrogen may be introduced by utilization of nitrogen-containing reducing gases.

The deposition methods disclosed herein may involve one or more purge gases. The purge gas, which is used to purge away unconsumed reactants and/or reaction by-products, is an inert gas that does not react with the precursors. Exemplary purge gases include, but are not limited to, argon, nitrogen, helium, neon, hydrogen, and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the silicon precursor compounds, oxidizing gas, reducing gas, and/or other precursors, source gases, and/or reagents may be performed by changing the sequences for supplying them and/or changing the stoichiometric composition of the resulting dielectric film.

Energy is applied to the at least one of the silicon precursor compounds of Formula (I) and oxidizing gas, reducing gas, or combination thereof to induce reaction and to form the silicon-containing film on the microelectronic device substrate. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The compounds of Formula (I) can be prepared by reacting tribromomethane with chlorodimethylsilane in the presence of magnesium. By way of example, Scheme 2 below illustrates the synthesis of a compound of Formula (I) wherein each $R^1$ is hydrogen and each $R^2$ is methyl. i.e., TDMSM:

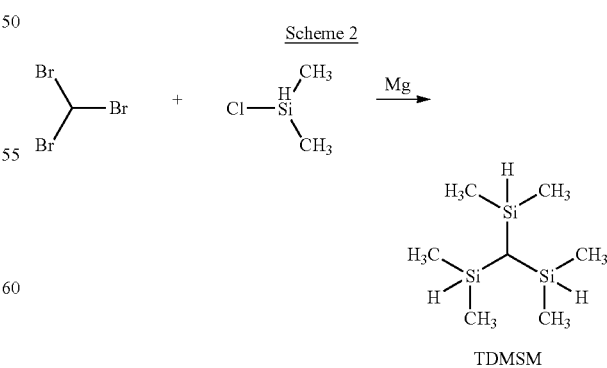

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1—Synthesis of TDMSM

Chloromethylsilane (80 g, 0.85 mole), Bromoform (71.16 g, 0.28 mole), and Magnesium (20.55 g,0.85 mol) were placed into a 1 L 3-neck round bottom flask. The reaction mixture was reacted at room temperature. Since heat is generated during the reaction, the temperature of reaction mixture was cool down to room temperature after the reaction is over. The product was purified by a simple distillation at 53° C. under 9 torr to yield the final product as a colorless liquid (13 g, 24%).

Example 2—General Procedure for Vapor Deposition Using TDMSM with Ozone as Oxidizing Gas A silicon oxide film was deposited with Tris(dimethylsilyl)methane which was placed in a bubbler at 25~40° C. Double shower head ALD reactor was used to deposit the silicon oxide film on a silicon wafer with ozone reactant from 450° C. to 650° C. as the wafer temperature calibrated by thermocouple (TC) wafer, and the reactor pressure was controlled at 0.5 to 2.0 Torr. A silicon oxide deposition was followed by 21~28 second silicon pulse, 15~40 second Ar purge, 30 second ozone pulse and 15~40 second Ar purge; and this cycle was repeated for 150 cycles to give a film thickness of 250 Å. It was saturated about 1.8 Å/cycle at 650° C. without carbon and chlorine impurities in the film. Data for 3 different wafer temperatures is set forth below in Table 1.

TABLE 1

| Wafer Temperature (° C.) | Precursor dose (sccm) | Ozone dose (sccm) | Growth rate (Å/cycle) | Refractive index |
|---|---|---|---|---|
| 590 | 21 | 30 | 1.69 | 1.46 |
| 600 | 21 | 30 | 1.64 | 1.45 |
| 650 | 21 | 30 | 1.86 | 1.43 |

Example 3—Methodology for Measuring Wet Etch Rate (WER) for TDSM

Figure 3:
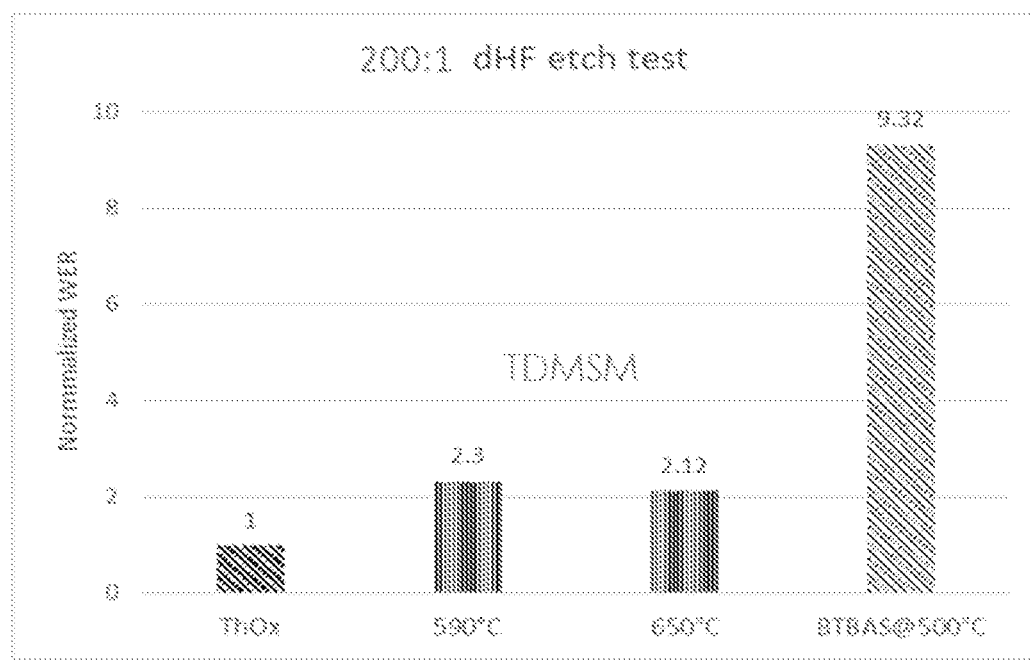
FIG. 3 is a wet etch rate comparison (200:1 dilute HF) using thermal oxide as a normalized benchmark=1. This graph illustrates greatly improved wet etch performance of an exemplary compound of Formula (I) of the present invention, i.e., TDMSM, over the known silicon precursor, BTBAS (bis(tertiary-butylamino)silane).
Figure 4:
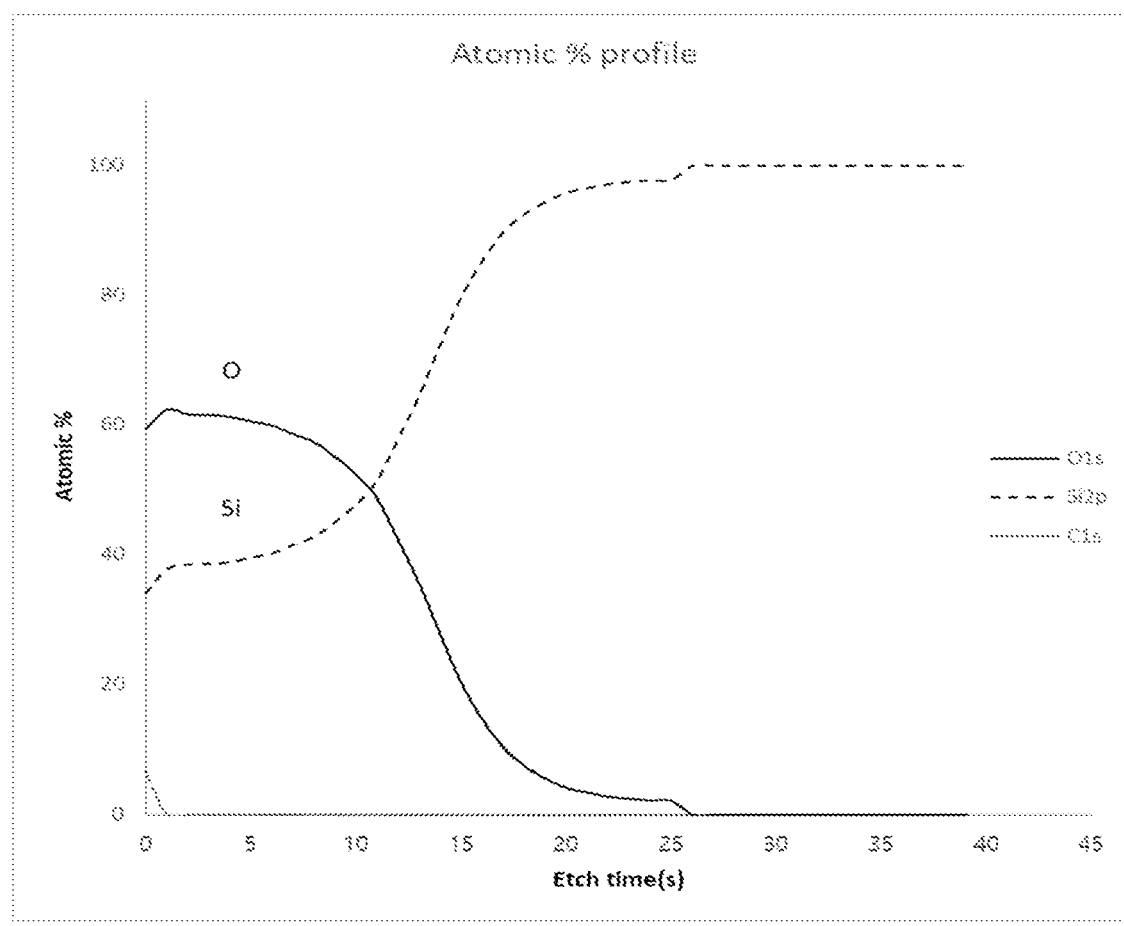
FIG. 4 is an atomic percentage profile of an $SiO_2$ film formed utilizing TDMSM and ozone. This data illustrates that there is no measurable quantity of carbon or chlorine in the $SiO_2$ film.

The wet etch measurement process utilized herein used a solution of 200:1 of 49% hydrofluoric (0.25 wt % dHF) acid. Thermal oxide layer was used as reference; typically the wet etch rate (WER) of thermal oxide for 0.25 wt % dHF is approximately 0.23 Å/second. A silicon oxide layer was etched using diluted HF etch process for 60 seconds, WER was estimated thickness change before and after wet etching. FIG. 3 illustrates the relative WER to thermal oxide for the silicon oxide film deposited at various wafer temperature with TDSM and ozone and BTBAS and ozone.

The invention has been described in detail with particular reference to certain embodiments thereof, but it will be understood that variations and modifications can be affected within the spirit and scope of the invention.

The invention claimed is:

1. A method for forming a silicon-containing film on a surface of a microelectronic device in a reaction zone, which comprises introducing

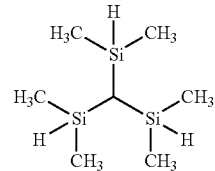

to said reaction zone, under vapor deposition conditions.

2. The method of claim 1, wherein the vapor deposition conditions are chosen from chemical vapor deposition (CVD), atomic layer deposition (ALD), plasma-enhanced ALD (PEALD), plasma enhanced cyclical chemical vapor deposition (PECCVD), a flowable chemical vapor deposition (FCVD), or a plasma-enhanced ALD-like process.

3. The method of claim 1, wherein said silicon-containing film is chosen from silicon dioxide, silicon nitride, silicon oxynitride, silicon carbide, silicon carbonitride, silicon oxycarbonitride, low-k thin silicon-containing films, high-k gate silicate films and low temperature silicon epitaxial films.

4. The method of claim 1, wherein the surface is chosen from silicon dioxide, silicon nitride, aluminum oxide, aluminum nitride, aluminum, tungsten, copper, cobalt, molybdenum, ruthenium, a silicon wafer, or combinations thereof.

5. The method of claim 1, wherein the vapor deposition conditions comprise atomic layer deposition conditions, at a temperature of about 100° C. to about 1000° C.

6. The method of claim 1, wherein the vapor deposition conditions comprise atomic layer deposition conditions at a temperature of about 100° C. to about 800° C.

7. The method of claim 1, wherein the vapor deposition conditions comprise atomic layer deposition conditions at a temperature of about 500 to about 750° C.

8. The method of claim 1, wherein the vapor deposition conditions comprise a gas chosen from $H_2$, $H_2$ plasma, $H_2/O_2$ mixtures, water, $N_2O$, $N_2O$ plasma, $NH_3$, $NH_3$ plasma, $N_2$, or $N_2$ plasma.

9. The method of claim 1, wherein the vapor deposition conditions comprise atomic layer deposition conditions with an oxidizing gas chosen from oxygen, oxygen plasma, and ozone.

10. The method of claim 9, wherein the oxidizing gas is ozone.

11. The method of claim 10, wherein the silicon-containing film is silicon dioxide, and wherein the silicon dioxide film thus formed exhibits a 200:1 dilute hydrogen fluoride solution wet etch rate which is at least about 70% improved compared to that of $SiO_2$ deposited with bis(tertiary-butylamino) silane (BTBAS) and ozone.

* * * * *